United States Patent
You et al.

(10) Patent No.: US 11,521,887 B2
(45) Date of Patent: Dec. 6, 2022

(54) METHOD OF TRANSFERRING MICRO LED AND MICRO LED TRANSFERRING APPARATUS

(71) Applicant: SEOUL VIOSYS CO., LTD., Ansan-si (KR)

(72) Inventors: Ik Kyu You, Ansan-si (KR); Jung Jae Lee, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

(21) Appl. No.: 17/122,995

(22) Filed: Dec. 15, 2020

(65) Prior Publication Data

US 2021/0193497 A1 Jun. 24, 2021

Related U.S. Application Data

(60) Provisional application No. 62/949,701, filed on Dec. 18, 2019.

(51) Int. Cl.
*H01L 21/683* (2006.01)
*H01L 25/075* (2006.01)
*H01L 33/62* (2010.01)

(52) U.S. Cl.
CPC ...... *H01L 21/6835* (2013.01); *H01L 25/0753* (2013.01); *H01L 33/62* (2013.01);
(Continued)

(58) Field of Classification Search
CPC . H01L 21/6835; H01L 25/0753; H01L 33/62; H01L 2221/68354; H01L 2221/68368; H01L 2933/0066; H01L 2221/68322; H01L 21/67144; H01L 33/0095
(Continued)

(56) References Cited

U.S. PATENT DOCUMENTS 9,105,600 B2 * 8/2015 Yamaguchi ........... H01L 23/433
10,636,937 B2 * 4/2020 Liao .................... H01L 33/0095
(Continued)

FOREIGN PATENT DOCUMENTS

JP 2018-163900 10/2018
KR 10-2018-0075310 7/2018
(Continued)

OTHER PUBLICATIONS

International Search Report dated Mar. 26, 2021, issued to PCT/KR2020/018414.

*Primary Examiner* — Vu A Vu
(74) *Attorney, Agent, or Firm* — H.C. Park & Associates, PLC

(57) ABSTRACT

A method of transferring a plurality of micro LEDs formed on a substrate including transferring the micro LEDs onto a first carrier substrate having a first adhesive material layer, reducing an adhesiveness of the first adhesive material layer by curing the first adhesive material layer, transferring the micro LEDs from the first carrier substrate onto a second carrier substrate having a second adhesive material layer, bonding at least a portion of the micro LEDs on the second carrier substrate to pads of a circuit board using a metal bonding layer, and separating the second carrier substrate from the micro LEDs bonded onto the circuit board.

20 Claims, 5 Drawing Sheets

(52) U.S. Cl.
CPC ............... *H01L 2221/68354* (2013.01); *H01L 2221/68368* (2013.01); *H01L 2933/0066* (2013.01)

(58) Field of Classification Search
USPC .......................................................... 438/28
See application file for complete search history.

(56) References Cited

U.S. PATENT DOCUMENTS

| | | | |
|---|---|---|---|
| 10,984,708 B1 * | 4/2021 | Pourchet | ................ H01L 33/62 |
| 2018/0166429 A1 | 6/2018 | Chong et al. | |

FOREIGN PATENT DOCUMENTS

| KR | 10-2019-0060287 | 6/2019 |
|---|---|---|
| KR | 10-2019-0127666 | 11/2019 |
| KR | 10-2019-0136824 | 12/2019 |

* cited by examiner

METHOD OF TRANSFERRING MICRO LED AND MICRO LED TRANSFERRING APPARATUS

This application claims priority the benefit of U.S. Provisional Application No. 62/949,701, filed Dec. 18, 2019, which is hereby incorporated by reference for all purposes as if fully set forth herein.

BACKGROUND

Field

Exemplary embodiments relate to a micro LED transferring apparatus and a method of transferring micro LEDs using the same.

Discussion of the Background

As an inorganic light source, light emitting diodes have been used in various fields including displays, vehicular lamps, general lighting, and the like. With various advantages of the light emitting diodes over conventional light sources, such as longer lifespan, lower power consumption, and rapid response, light emitting diodes have been replacing conventional light sources.

Light emitting diodes have been mainly used as backlight light sources in display apparatuses. However, recently, LED display apparatuses that directly display an image using small-sized light emitting diodes, such as micro LEDs, have been developed.

In general, a display apparatus realizes various colors through mixture of blue, green, and red light. In order to display various images, the display apparatus includes a plurality of pixels each including sub-pixels corresponding to blue, green, and red light, respectively. In this manner, a color of a certain pixel is determined based on the colors of the sub-pixels so that images can be displayed through combination of such pixels.

LEDs can emit light of various colors depending on their materials. As such, a display apparatus may be provided by employing individual micro LEDs emitting blue, green, and red arranged on a two-dimensional plane, or by employing micro LEDs having a stacked structure in which a blue LED, a green LED, and a red LED are stacked one above another arranged on a two-dimensional plane.

Micro LEDs used in one display apparatus usually require more than one million even for a small-sized display. Due to the small size of micro LEDs and the enormous number required, mass production of micro LED display apparatus with a conventional technology is almost impossible since the conventional die bonding technology mounts LED chips individually. Accordingly, a technology for transferring a plurality of micro LEDs onto a circuit board in a group has been recently developed. In such technology, micro LEDs formed on a wafer may be transferred onto the circuit board using a technique, such as selective laser lift-off.

However, transferring micro LEDs to specific locations of the circuit board in a group may be very difficult due to a difference in thermal expansion coefficients between the wafer and the circuit board.

The above information disclosed in this Background section is only for understanding of the background of the inventive concepts, and, therefore, it may contain information that does not constitute prior art.

SUMMARY

Exemplary embodiments provide a method of transferring micro LEDs and a micro LED transferring apparatus.

Additional features of the inventive concepts will be set forth in the description which follows, and in part will be apparent from the description, or may be learned by practice of the inventive concepts.

A method of transferring a plurality of micro LEDs formed on a substrate according to an exemplary embodiment includes transferring the micro LEDs onto a first carrier substrate having a first adhesive material layer, reducing an adhesiveness of the first adhesive material layer by curing the first adhesive material layer, transferring the micro LEDs from the first carrier substrate onto a second carrier substrate having a second adhesive material layer, bonding at least a portion of the micro LEDs on the second carrier substrate to pads of a circuit board using a metal bonding layer, and separating the second carrier substrate from the micro LEDs bonded onto the circuit board.

An adhesiveness of the second adhesive material layer may be greater than that of the cured first adhesive material layer and less than bonding force of the metal bonding layer.

The first adhesive material layer may include an ultraviolet tape, and the second adhesive material layer comprises a highly heat-resistant tape.

The first adhesive material layer may be cured by irradiating an ultraviolet ray.

The ultraviolet ray may be irradiated to only regions of the first carrier substrate overlapping the micro LEDs.

The adhesiveness of the first adhesive material layer may be reduced to $1/100$ or less by curing.

A difference between a thermal expansion coefficient of the second carrier substrate and a thermal expansion coefficient of the circuit board may be less than 10% of a thermal expansion coefficient of the circuit board.

A micro LED transferring apparatus according to another exemplary embodiment including a loading device configured to load a wafer divided into a plurality of sections, each section including at least one or more of micro LEDs formed on a substrate, a transport device configured to pick up the section from the loading device and transport the section onto a first adhesive material layer of a first carrier substrate, a laser irradiation device configured to irradiate a laser to the section, a substrate separation device configured to separate the substrate from the micro LEDs, a curing device configured to cure the first adhesive material layer, and a pickup device configured to pick up the micro LEDs from the first carrier substrate using a second carrier substrate having a second adhesive material layer.

The micro LED transferring apparatus may further include an unloading device configured to unload the second carrier substrate that picked up the micro LEDs.

The pickup device may be configured to bond at least a portion of the micro LEDs picked up by the second carrier substrate onto a circuit board, and to separate the portion of the micro LEDs from the second carrier substrate.

The micro LED transferring apparatus may further include an unloading device configured to unload the circuit board onto which the micro LEDs are bonded.

The micro LED transferring apparatus may further include a bonding device configured to bond at least a portion of the micro LEDs picked up by the second carrier substrate onto a circuit board, and to separate the portion of the micro LEDs from the second carrier substrate.

The first adhesive material layer may include an ultraviolet tape, and the second adhesive material layer may include a highly heat-resistant tape.

The curing device may be configured to cure the first adhesive material layer by irradiating an ultraviolet ray.

The curing device may be configured to irradiate only regions of the of the first carrier substrate overlapping the micro LEDs with the ultraviolet ray.

A method of transferring a plurality of micro LEDs formed on a substrate according to still another exemplary embodiment includes transferring the micro LEDs from the substrate to a first carrier substrate on which a first material layer having a first adhesiveness is formed, transferring the micro LEDs from the first carrier substrate to a second carrier substrate on which a second material layer having a second adhesiveness is formed, and selectively transferring a portion of the micro LEDs from the second carrier substrate to a circuit board on which a third material layer having a third adhesiveness is formed, in which the third adhesiveness is greater than the second adhesiveness, and the second adhesiveness is greater than the first adhesiveness.

The first adhesiveness may be changed after removing the substrate from the micro LEDs.

Transferring the micro LEDs from the substrate to the first carrier substrate may include irradiating a laser in a first direction, transferring the micro LEDs from the first carrier substrate to the second carrier substrate may include irradiating ultraviolet light in a second direction opposite to the first direction, and selectively transferring the portion of the micro LEDs may include applying heat.

The first carrier substrate may transmit ultraviolet light.

A difference between a thermal expansion coefficient of the second carrier substrate and a thermal expansion coefficient of the circuit board may be less than 10% of a thermal expansion coefficient of the circuit board It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
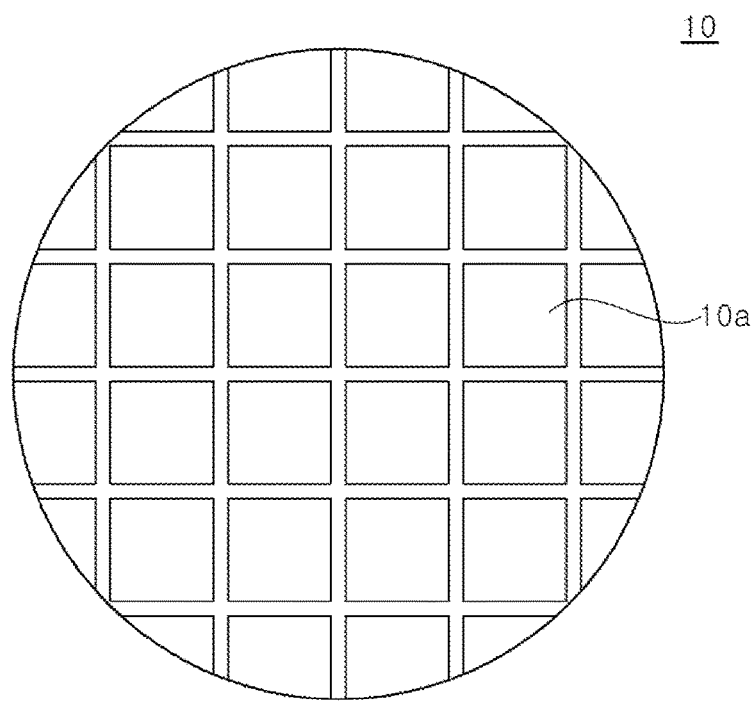
FIG. 1 is a schematic plan view illustrating a wafer on which micro LEDs are formed.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, exemplary embodiments of the inventive concepts will be described in detail with reference to the accompanying drawings.

Micro LEDs according to exemplary embodiments may be used in a VR display apparatus such as a smart watch, a VR headset, or an AR display apparatus such as an augmented reality glasses, without being limited thereto. In these display apparatuses, a display panel on which micro LEDs are mounted may be employed to display an image. After the micro LEDs are formed on a wafer, the micro LEDs are transferred to a circuit board, so that the display panel can be manufactured. Hereinafter, a method of transferring micro LEDs will be described in detail.

Figure 2:
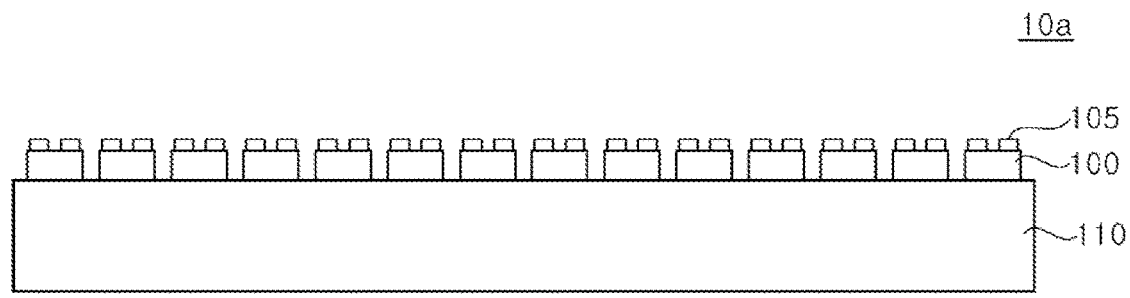
FIG. 2 is a schematic cross-sectional view illustrating a divided section in the wafer of FIG. 1.

FIG. 1 is a schematic plan view illustrating a wafer 10 on which micro LEDs are formed, and FIG. 2 is a schematic cross-sectional view illustrating a divided section 10a in the wafer of FIG. 1.

Referring to FIGS. 1 and 2, a plurality of micro LEDs 100 may be formed on a wafer 10. To transfer micro LEDs 100 to a desired region of a display panel, the wafer 10 on which the micro LEDs 100 are formed may be divided (or singularized) into a plurality of sections 10a (or divided sections 10a). FIG. 2 is a cross-sectional view of the divided section 10a. The micro LEDs 100 may be formed on a substrate 110, and the substrate 110 is divided together when the wafer 10 is divided. The micro LEDs 100 may be transferred using the divided section 10a. Since the divided section 10a is small in size, bowing thereof may be reduced compared to the wafer 10. The substrate 110 may be a growth substrate capable of growing an epitaxial layer thereon, for example, a sapphire substrate, a GaAs substrate, a silicon substrate, a GaN substrate, or a SiC substrate, or the like, but the inventive concepts are not limited thereto.

The micro LED 100 may have, for example, a size smaller than 500 µm×500 µm, and further, smaller than 100 µm×100 µm. A structure of the micro LED 100 is not particularly limited. In an exemplary embodiment, the micro LED 100 may be employed as a sub-pixel that emits light of a specific color, and these sub-pixels may form one pixel. For example, a blue micro LED, a green micro LED, and a red micro LED may be adjacently disposed to one another to form one pixel. Micro LEDs emitting light of a specific color may be formed on one wafer 10. In another exemplary embodiment, each of the micro LEDs 100 may have a stacked structure that emits light of various colors. For example, each of the micro LEDs 100 may have a stacked structure, in which a blue LED, a green LED, and a red LED are overlapped with one another, and thus, one micro LED 100 may form one pixel.

The micro LEDs 100 may have pads 105, and the pads 105 may be adhered to corresponding pads of a circuit board through a bonding layer.

FIGS. 3, 4, 5, 6, 7, and 8 are schematic cross-sectional views illustrating a method of transferring micro LEDs onto a circuit board according to an exemplary embodiment.

Figure 3:
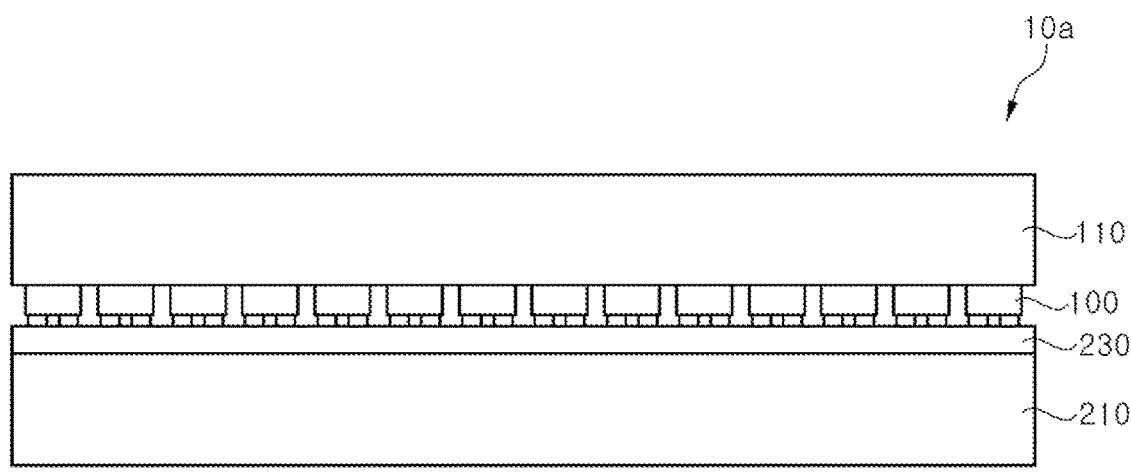
FIGS. 3, 4, 5, 6, 7, and 8 are schematic cross-sectional views illustrating a method of transferring micro LEDs onto a circuit board according to an exemplary embodiment.

Referring to FIG. 3, a first carrier substrate 210 having one surface formed with a first adhesive material layer 230 is provided. For example, the first adhesive material layer 230 may be a double-sided tape. As another example, the first adhesive material layer 230 may be a layer that may change adhesiveness by curing. In particular, the first adhesive material layer 230 may be a material layer that have a reduced adhesiveness after curing, such as an ultraviolet (UV) tape. The ultraviolet tape may be cured by UV irradiation, and an adhesiveness thereof is reduced to about 1/100 or less, further to about 1/200 or less when cured. For example, adhesion of the first adhesive material layer 230 may be about 100 gf/mm before curing, which may be reduced to about 0.5 gf/mm after curing.

The first carrier substrate 210 may be a light-transmitting substrate. The material of the first carrier substrate 210 is not particularly limited. In an exemplary embodiment, the first carrier substrate 210 may be formed of a material having the same or similar thermal expansion coefficient as the substrate 110. For example, when the substrate 110 is a sapphire substrate, the first carrier substrate 210 may also be a sapphire substrate. The first carrier substrate 210 may be as thick as, or thicker than the substrate 110. When the first carrier substrate 210 is thicker than the substrate 110, the micro LEDs 100 that have been transferred may be more stably held, and furthermore, the first carrier substrate 210 may be prevented from or at least be suppressed from bending.

The micro LEDs 100 in the divided section 10a are attached on the first adhesive material layer 230 before curing. Each of the micro LEDs 100 on the substrate 110 may be attached to the first adhesive material layer 230.

Subsequently, the substrate 110 is removed from the micro LEDs 100 using a technique, such as laser lift off (LLO), or the like. The first adhesive material layer 230, such as UV tape, may prevent locations of the micro LEDs 100 from being changed while the substrate 110 is separated using the laser lift-off.

Figure 4:
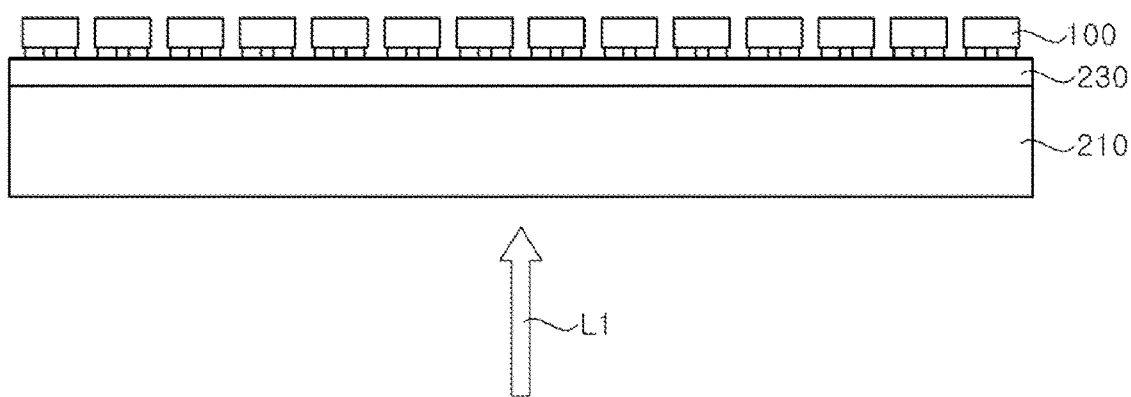

Referring to FIG. 4, after the substrate 110 is removed, the first adhesive material layer 230 is cured. For example, the first adhesive material layer 230 may be cured using UV light L1. In this manner, adhesiveness of the first adhesive material layer 230 may be reduced by curing.

UV light L1 may be irradiated from a lower portion of the first carrier substrate 210. To this end, the first carrier substrate 210 may transmit UV. As such, UV light L1 reaches the first adhesive material layer 230 to which the micro LEDs 100 are attached. UV light L1 may be simultaneously irradiated or continuously irradiated to a plurality of micro LEDs 100.

Figure 5:
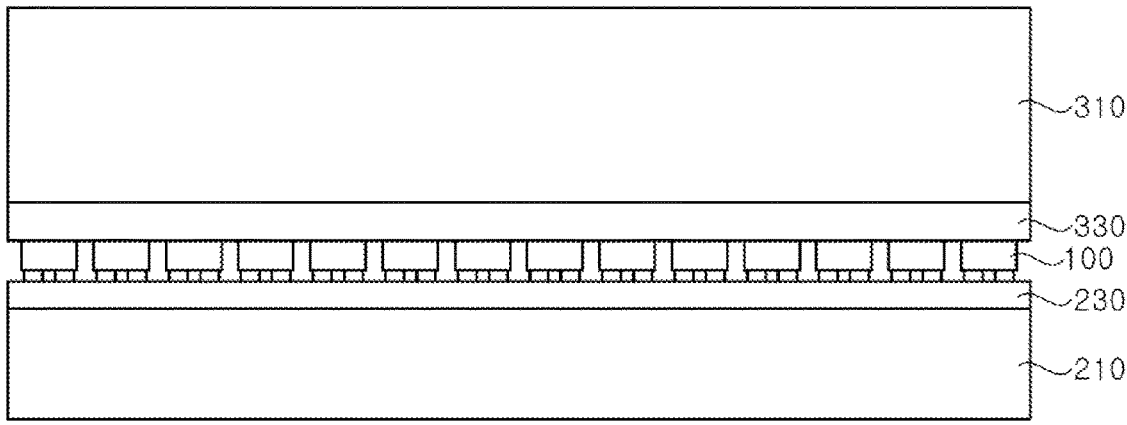

Referring to FIG. 5, the micro LEDs 100 are attached to a second carrier substrate 310 having a second adhesive material layer 330. The second adhesive material layer 330 has an adhesiveness greater than that of the first adhesive material layer 230 after curing or before curing the first adhesive material layer 230. For example, the second adhesive material layer 330 may be a highly heat-resistant tape. The highly heat-resistant tape may safely hold the micro LEDs 100 while the micro LEDs 100 are bonded. The second adhesive material layer 330, for example, may have an adhesiveness of about 20 gf/mm, and may include a material layer that is stable at a temperature of 180° C. or higher, further 280° C. or higher, and furthermore 300° C. or higher.

The second carrier substrate 310 may be selected in consideration of a thermal expansion coefficient of the circuit board to which the micro LEDs 100 are to be transferred. When the thermal expansion coefficient of the second carrier substrate 310 is the same as or similar to that of the circuit board, locations of the micro LEDs may be prevented from being changed when the micro LEDs 100 are bonded onto the circuit board using a high temperature process, such as solder bonding.

Figure 6:
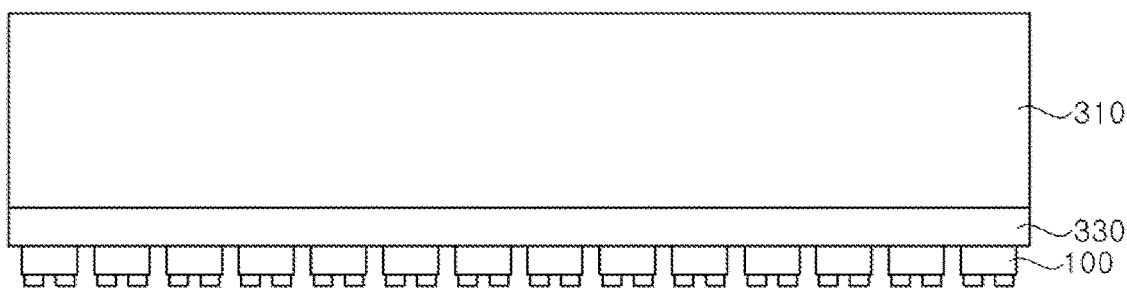

Referring to FIG. 6, the first carrier substrate 210 and the first adhesive material layer 230 are removed from the micro LEDs 100. The first adhesive material layer 230 has a considerably weaker adhesiveness than the second adhesive material layer 330 when cured, and thus, the first adhesive material layer 230 may be easily removed from the micro LEDs 100 using physical force.

Figure 7:
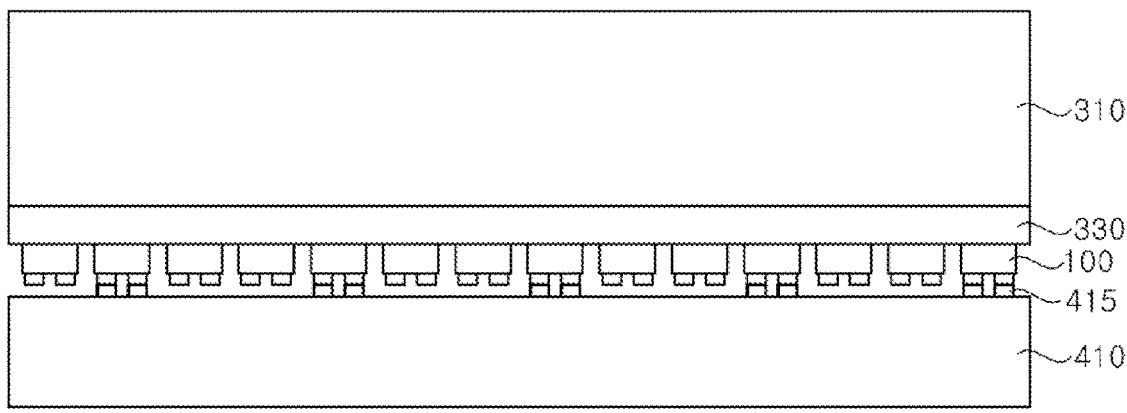
Figure 8:
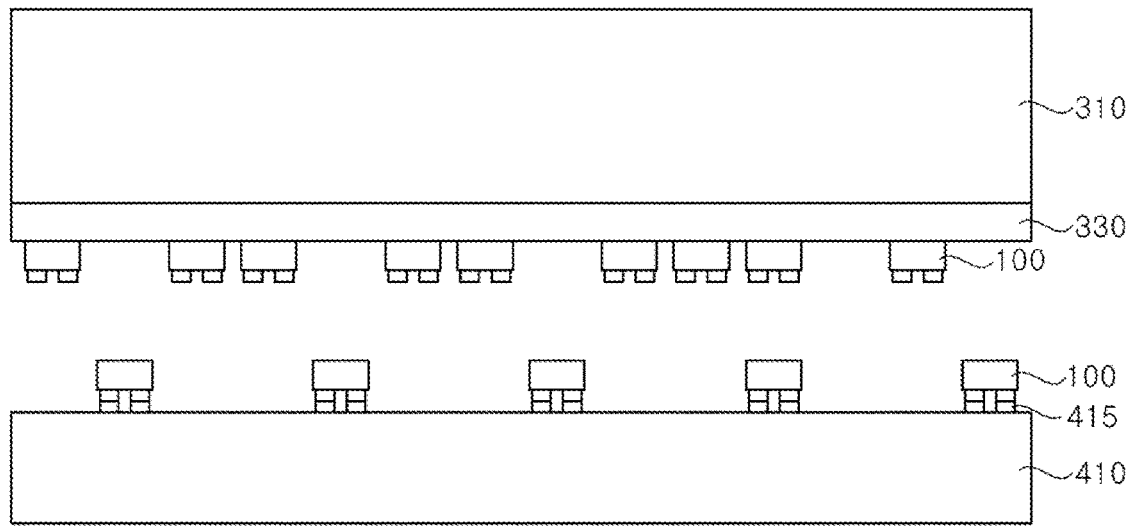
Figure 9:
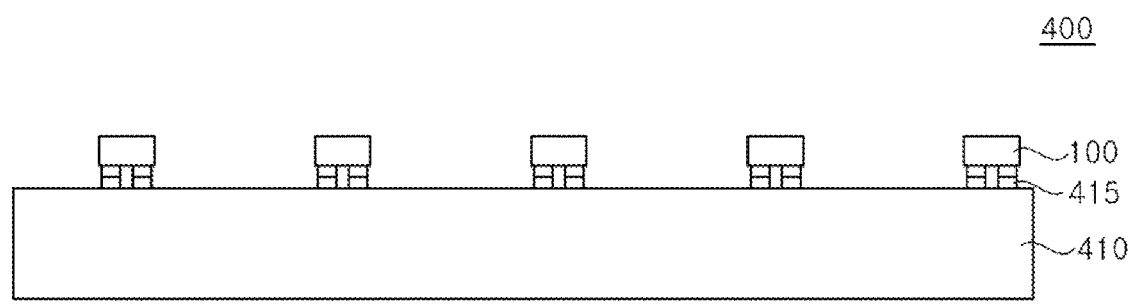
FIG. 9 is a schematic cross-sectional view illustrating a display panel according to an exemplary embodiment.

Referring to FIG. 7, at least a portion of the micro LEDs 100 attached to the second carrier substrate 310 is bonded onto a circuit board 410. The circuit board 410 may include a circuit for passive matrix driving or active matrix driving. In an exemplary embodiment, the circuit board 410 may include interconnection lines and a resistor therein. In another exemplary embodiment, the circuit board 410 may include interconnection lines, transistors, and capacitors. For example, the circuit board 410 may be a glass substrate including a thin film transistor. The circuit board 410 may also have pads 415 disposed on an upper surface thereof to allow electrical connection to the circuit therein. The pads 415 may be disposed in each region to which the micro LEDs 100 are to be transferred. The micro LEDs 100 may be bonded to the pads 415 using a metal bonding material, such as AuSn, CuSn, or In.

The micro LEDs 100 arranged on the second carrier substrate 310 may be more densely arranged than the micro LEDs 100 arranged on the circuit board 410. As such, a portion of the micro LEDs 100 on the second carrier substrate 310 may be selectively transferred to the circuit board 410. As such, a distance between the micro LEDs 100 transferred onto the circuit board 410 may be greater than a width of the micro LED 100.

After the micro LEDs 100 are bonded to the pads 415 of the circuit board 410, the second carrier substrate 310 is separated from the circuit board 410. Bonding force of the micro LEDs 100 by metal bonding is greater than bonding force by the second adhesive material layer 330. As such, the micro LEDs 100 bonded to the pads 415 are transferred to the circuit board 410. In this manner, a display panel 400 in which the micro LEDs 100 are arranged on the circuit board 410 may be provided.

Meanwhile, other micro LEDs 100 that are not bonded to the pads 415 of the circuit board 410 may be retained on the second carrier substrate 310 by the second adhesive material layer 330. These micro LEDs 100 may be transferred onto another circuit board through the manufacturing process described above.

When the micro LEDs 100 are bonded onto the circuit board 410 using a metal bonding layer, heat is applied to the circuit board 410 and the second carrier board 310. In this case, when a difference in thermal expansion coefficient between the circuit board 410 and the second carrier board 310 is large, bonding failure may occur in the micro LEDs. As such, the second carrier substrate 310 may be selected in consideration of the thermal expansion coefficient of the circuit board 410. For example, the difference between the thermal expansion coefficient of the second carrier substrate 310 and that of the circuit board 410 according to an exemplary embodiment may be less than 10% of the thermal expansion coefficient of the circuit board 410.

Figure 10:
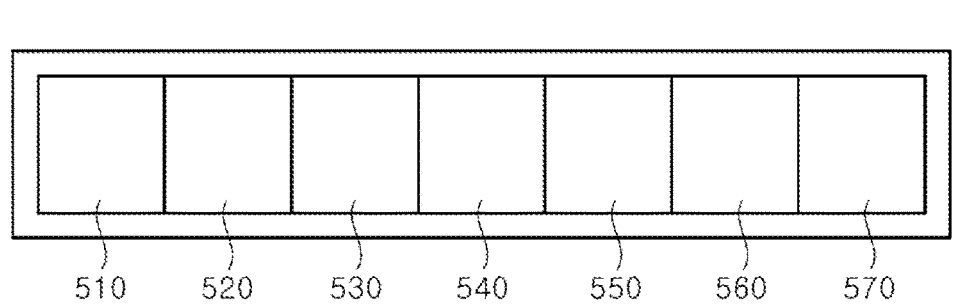
FIG. 10 is a schematic diagram illustrating a micro LED transferring apparatus according to an exemplary embodiment.

FIG. 10 is a schematic diagram illustrating a micro LED transferring apparatus 1000 according to an exemplary embodiment.

Referring to FIG. 10, the micro LED transferring apparatus 1000 according to an exemplary embodiment may include a loading device 510, a transport device 520, a laser irradiation device 530, a substrate separation device 540, a curing device 550, a pickup and bonding device 560, and an unloading device 570.

The loading device 510 is used to load the wafer 10 described in FIG. 1. The wafer 10 may be loaded into the loading device 510 while being divided into a plurality of sections 10a. For example, the wafer 10 may be formed with scribing lines that cross each other by which the sections 10a may be defined. In this case, while each section 10a may be defined in the wafer 10, the sections 10a may not be individualized from the wafer 10 to facilitate the loading process and handling of multiple sections 10a. In some exemplary embodiments, a plurality of wafers 10 may be mounted on a cassette and loaded into the loading device 510. The wafers 10 loaded in the loading device 510 may be sequentially transferred to the transport device 520.

Once the wafer 10 is transported to the transport device 520 from the loading device 10, the transport device 520 separates (or singularizes) the divided section 10a from the wafer 10, and places the divided section 10a on a first adhesive material layer 230 of a first carrier substrate 210 as shown in FIG. 3. A plurality of first carrier substrates 210 having the first adhesive material layer 230 may be stored in the transport device 520. In this case, one of the first carrier substrates 210 stored in the transport device 520 may be selected, and the divided section 10a may be attached onto the first carrier substrate 210 by the first adhesive material layer 230. The first carrier substrate 210 to which the divided section 10a is attached may be transported to the laser irradiation device 530.

The laser irradiation device 530 irradiates a laser to a substrate 110 to separate the micro LEDs 100 from the substrate 110. This process is known in the art as laser lift off. The laser may be irradiated to each region of the micro LEDs 100 through the substrate 110.

The substrate separation device 540 separates the substrate 110 from the micro LEDs 100 on which the laser lift-off process has been performed. The substrate 110 may be collected at the substrate separation device 540, and the substrate separation device 540 may collect a plurality of substrates 110. After the substrate 110 is separated, the first carrier substrate 210 on which the micro LEDs 100 are attached is moved to the curing apparatus 550.

The curing device 550 cures the first adhesive material layer 230. The curing device 550 may cure the first adhesive material layer 230 using, for example, UV. UV may be irradiated to the first adhesive material layer 230 through the first carrier substrate 210 as shown in FIG. 4. UV may be irradiated on an entire surface of the first adhesive material layer 230, but the inventive concepts are not limited thereto. In some exemplary embodiments, UV may be limitedly irradiated to regions of the first carrier substrate 210 to which the micro LEDs 100 are attached. In this manner, the adhesiveness of the first adhesive material layer 230 may be reduced by curing. After the first adhesive material layer 230 is cured, the first carrier substrate 210 is moved to the pickup and bonding device 560.

In the pickup and bonding apparatus 560, a second carrier substrate 310 having a second adhesive material layer 330 is stored. The second carrier substrate 310 picks up the micro LEDs 100 from the first carrier substrate 210 using the second adhesive material layer 330, as shown in FIG. 5. The second carrier substrate 310 from which the micro LEDs 100 are separated is collected in the pickup and bonding device 560 and removed.

The circuit board 410 may also be stored in the pickup and bonding device 560, and at least a portion of the micro LEDs 100 picked up by the second carrier board 310 is bonded to pads 415 of the circuit board 410. As shown in FIG. 7, the second carrier substrate 310 is spaced apart from the circuit board 410.

The circuit board 410 to which the micro LEDs 100 are bonded is moved to the unloading device 570. Meanwhile, the micro LEDs 100 retained on the second carrier substrate 310 may be bonded to another circuit board. After the micro LEDs 100 are transferred to one or more circuit boards 410, the second carrier substrate 310 may be collected in the bonding device 560 and removed.

The unloading device 570 unloads a display panel 400 in which the micro LEDs 100 are arranged on the circuit board 410.

In the illustrated exemplary embodiment, the loading device 510, the transport device 520, the laser irradiation device 530, the substrate separation device 540, the curing device 550, the pickup and bonding device 560, and the loading device 570 may be linearly arranged. In this manner, the micro LEDs 100 may be continuously transferred from the wafer 10 to the circuit board 410 using the transferring apparatus 1000 according to the illustrated exemplary embodiment.

Figure 11:
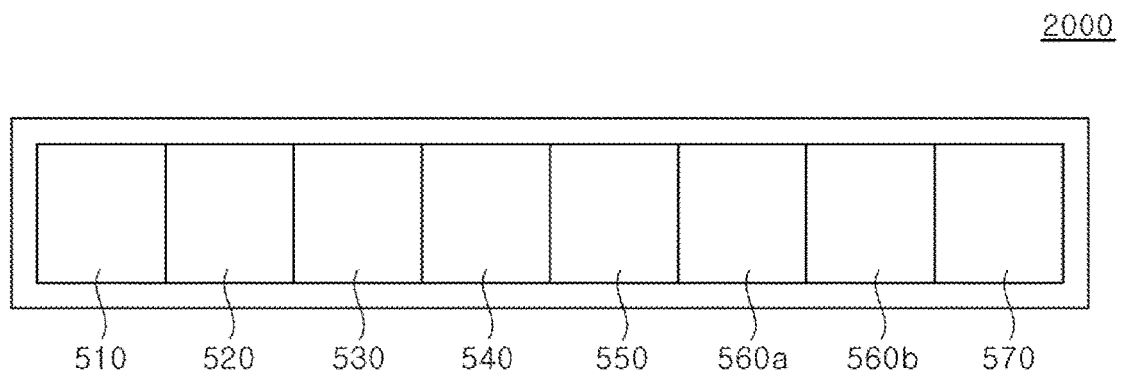
FIG. 11 is a schematic diagram illustrating a micro LED transferring apparatus according to another exemplary embodiment.

FIG. 11 is a schematic diagram illustrating a micro LED transferring apparatus 2000 according to another exemplary embodiment.

Referring to FIG. 11, the transferring apparatus 2000 according to the illustrated exemplary embodiment is substantially similar to the transferring apparatus 1000 described above, except that a pickup and bonding device 560 is divided into a pickup device 560a and a bonding device 560b. Accordingly, repeated descriptions of some of the manufacturing process already described above will be omitted or briefly explained, and the differences will be mainly described.

In the illustrated exemplary embodiment, after a first adhesive material layer 230 is cured, a first carrier substrate 210 is transported to the pickup device 560a. A second carrier substrate 310 having a second adhesive material layer 330 is stored in the pickup device 560a. The second carrier substrate 310 picks up the micro LEDs 100 on the first carrier substrate 210 using the second adhesive material layer 330. The second carrier substrate 310 adhered to the micro LEDs 100 is transported to the bonding device 560b.

A circuit board 110 may be stored in the bonding device 560b, and at least a portion of the micro LEDs 100 picked up by the second carrier board 310 is selectively bonded to pads 415 of the circuit board 410. Thereafter, the second carrier substrate 310 is separated from the circuit board 410 and the micro LEDs 100 are transferred onto the circuit board 410. The second carrier substrate 310 from which the micro LEDs 100 are separated may be collected in the pickup device 560a and removed.

The circuit board 410 to which the micro LEDs 100 are bonded is transported to an unloading device 570. Meanwhile, the micro LEDs 100 retained on the second carrier substrate 310 may be bonded to another circuit board, and after the micro LEDs 100 are transferred to the circuit board, the second carrier substrate 310 may be collected in the bonding device 560b and removed.

According to the illustrated exemplary embodiment, by separating the pickup device 560a and the bonding device 560b, the transferring process of the micro LEDs 100 may be performed more quickly.

Meanwhile, although a display panel 400 is exemplarily described as being manufactured in the transferring apparatus 2000, in some exemplary embodiments, the display panel 400 may be manufactured outside of the transferring apparatus 2000, and the unloading device 570 may unload the second carrier substrate 310 that picked up the micro LEDs 100. In this case, the bonding device 560b may be omitted.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A method of transferring a plurality of micro LEDs formed on a substrate, comprising:
    transferring the micro LEDs onto a first carrier substrate having a first adhesive material layer, such that a first surface of the micro LEDs is attached to the first adhesive material layer, each of the micro LEDs comprising a stack of a red LED, a green LED, and a blue LED overlapping with each other;
    reducing an adhesiveness of the first adhesive material layer by curing the first adhesive material layer;
    transferring the micro LEDs from the first carrier substrate onto a second carrier substrate having a second adhesive material layer, such that a second surface of the micro LEDs opposite to the first surface is attached to the second adhesive material layer;
    bonding at least a portion of the micro LEDs on the second carrier substrate to pads of a circuit board using a metal bonding layer, such that the stack of the red LED, the green LED, and the blue LED is simultaneously transferred to the circuit board; and
    separating the second carrier substrate from the micro LEDs bonded onto the circuit board.

2. The method of claim 1, wherein an adhesiveness of the second adhesive material layer is greater than that of the cured first adhesive material layer and less than bonding force of the metal bonding layer.

3. The method of claim 1, wherein:
    the first adhesive material layer comprises an ultraviolet tape; and
    the second adhesive material layer comprises a highly heat-resistant tape.

4. The method of claim 3, wherein the first adhesive material layer is cured by irradiating an ultraviolet ray.

5. The method of claim 4, wherein the ultraviolet ray is irradiated to only regions of the first carrier substrate overlapping the micro LEDs.

6. The method of claim 1, wherein the adhesiveness of the first adhesive material layer is reduced to $1/100$ or less by curing.

7. The method of claim 1, wherein a difference between a thermal expansion coefficient of the second carrier substrate and a thermal expansion coefficient of the circuit board is less than 10% of a thermal expansion coefficient of the circuit board.

8. A micro LED transferring apparatus, comprising:
    a loading device configured to load a wafer divided into a plurality of sections, each section including at least one or more of micro LEDs formed on a substrate, each micro LED comprising a stack of a red LED, a green LED, and a blue LED overlapping with each other;
    a transport device configured to pick up the section from the loading device and transport the section onto a first adhesive material layer of a first carrier substrate, such that a first surface of the micro LEDs is attached to the first adhesive material layer;
    a laser irradiation device configured to irradiate a laser to the section;
    a substrate separation device configured to separate the substrate from the micro LEDs;
    a curing device configured to cure the first adhesive material layer; and
    a pickup device configured to pick up the micro LEDs from the first carrier substrate using a second carrier substrate having a second adhesive material layer, such that a second surface of the micro LEDs opposite to the first surface is attached to the second adhesive material layer,
    wherein the pickup device is further configured to bond at least a portion of the micro LEDs picked up by the second carrier substrate onto a circuit board, such that the stack of the red LED, the green LED, and the blue LED is simultaneously transferred to the circuit board.

9. The micro LED transferring apparatus of claim 8, further comprising an unloading device configured to unload the second carrier substrate that picked up the micro LEDs.

10. The micro LED transferring apparatus of claim 8, wherein the pickup device is further configured to separate the portion of the micro LEDs from the second carrier substrate.

11. The micro LED transferring apparatus of claim 10, further comprising an unloading device configured to unload the circuit board onto which the micro LEDs are bonded.

12. The micro LED transferring apparatus of claim 8, further comprising a bonding device configured to bond at least a portion of the micro LEDs picked up by the second carrier substrate onto the circuit board, and to separate the portion of the micro LEDs from the second carrier substrate.

13. The micro LED transferring apparatus of claim 8, wherein:
    the first adhesive material layer comprises an ultraviolet tape; and
    the second adhesive material layer comprises a highly heat-resistant tape.

14. The micro LED transferring apparatus of claim 8, wherein the curing device is configured to cure the first adhesive material layer by irradiating an ultraviolet ray.

15. The micro LED transferring apparatus of claim 14, wherein the curing device is configured to irradiate only regions of the of the first carrier substrate overlapping the micro LEDs with the ultraviolet ray.

16. A method of transferring a plurality of micro LEDs formed on a substrate, comprising:
    transferring the micro LEDs from the substrate to a first carrier substrate on which a first material layer having a first adhesiveness is formed, such that a first surface of the micro LEDs is attached to the first material layer, each of the micro LEDs comprising a stack of a red LED, a green LED, and a blue LED overlapping with each other;
    transferring the micro LEDs from the first carrier substrate to a second carrier substrate on which a second material layer having a second adhesiveness is formed, such that a second surface of the micro LEDs is attached to the second material layer;
    selectively transferring a portion of the micro LEDs from the second carrier substrate to a circuit board on which a third material layer having a third adhesiveness is formed, such that the stack of the red LED, the green LED, and the blue LED is simultaneously transferred to the circuit board,
    wherein the third adhesiveness is greater than the second adhesiveness, and the second adhesiveness is greater than the first adhesiveness.

17. The method of claim 16, wherein the first adhesiveness is changed after removing the substrate from the micro LEDs.

18. The method of claim 16, wherein:
    transferring the micro LEDs from the substrate to the first carrier substrate includes irradiating a laser in a first direction;

transferring the micro LEDs from the first carrier substrate to the second carrier substrate includes irradiating ultraviolet light in a second direction opposite to the first direction; and selectively transferring the portion of the micro LEDs includes applying heat.

19. The method of claim 16, wherein the first carrier substrate transmits ultraviolet light.

20. The method of claim 16, wherein a difference between a thermal expansion coefficient of the second carrier substrate and a thermal expansion coefficient of the circuit board is less than 10% of a thermal expansion coefficient of the circuit board.

* * * * *